(12) United States Patent
Lin

(10) Patent No.: US 7,508,265 B2
(45) Date of Patent: Mar. 24, 2009

(54) RAIL-TO-RAIL CLASS-AB OPERATIONAL AMPLIFIER

(75) Inventor: Kun-Tsung Lin, Tai Chung (TW)

(73) Assignee: Orise Technology Co., Ltd., Hsinchu (TW)

(*) Notice: Subject to any disclaimer, the term of this patent is extended or adjusted under 35 U.S.C. 154(b) by 1 day.

(21) Appl. No.: 11/978,650

(22) Filed: Oct. 30, 2007

(65) Prior Publication Data

US 2008/0111626 A1   May 15, 2008

(30) Foreign Application Priority Data

Nov. 10, 2006   (TW) .............................. 95141606 A

(51) Int. Cl.
*H03F 3/45* (2006.01)
(52) U.S. Cl. ...................... 330/255; 330/257
(58) Field of Classification Search ................. 330/255, 330/257, 261, 253
See application file for complete search history.

(56) References Cited

U.S. PATENT DOCUMENTS

| | | | |
|---|---|---|---|
| 5,311,145 A | 5/1994 | Huijsing et al. | |
| 5,504,458 A | 4/1996 | Van Brunt et al. | |
| 5,659,266 A | 8/1997 | Shacter et al. | |
| 5,907,259 A * | 5/1999 | Yamada et al. | 327/563 |
| 6,121,839 A | 9/2000 | Giacomini et al. | |
| 7,330,074 B2 * | 2/2008 | Kang et al. | 330/255 |
| 7,352,243 B2 * | 4/2008 | Nishimura | 330/257 |

* cited by examiner

*Primary Examiner*—Henry K Choe
(74) *Attorney, Agent, or Firm*—Muncy, Geissler, Olds & Lowe, PLLC

(57) ABSTRACT

A rail-to-rail class-AB operational amplifier includes a first differential pair unit for receiving a pair of differential signals and generating a first control signal; a second differential pair unit for receiving the pair of differential signals and generating a second control signal; and an output stage for receiving the first control signal and the second control signal and then generating an output voltage. The first differential pair unit includes a first active load, a first transistor differential pair and a first current source. The second differential pair unit includes a second current source, a second transistor differential pair and a second active load. The output stage includes a third current source, a fourth current source and a parallel transistor pair disposed between a second terminal of the third current source and a first terminal of the fourth current source, a first output transistor and a second output transistor, and generates the output voltage according to the first control signal and the second control signal.

9 Claims, 6 Drawing Sheets

RAIL-TO-RAIL CLASS-AB OPERATIONAL AMPLIFIER

BACKGROUND OF THE INVENTION

This application claims the benefit of the filing date of Taiwan Application Ser. No. 095141606, filed on Nov. 10, 2005, the content of which is incorporated herein by reference.

1. Field of the Invention

The invention relates to a rail-to-rail class-AB operational amplifier.

2. Related Art

FIG. 1 shows a conventional rail-to-rail class-AB operational amplifier. As shown in FIG. 1, the operational amplifier includes a differential pair composed of NMOS transistors N1 and N2, and a differential pair composed of PMOS transistors P1 and P2, and the two differential pairs are connected in parallel to serve as an input. The output currents of the two differential pairs are summed up by a summing circuit composed of transistors N5, N6, N7, N8, P5 and P6, and the summed current is outputted from the node A. Thereafter, the voltage at the node A drives a class-AB output stage composed of transistors N9, N10, N12, N13, N14, P10, P11 and P12 to serve as an output of the operational amplifier so that the very great ability of outputting and sinking a current source would be obtained.

The rail-to-rail class-AB operational amplifier has a relatively large gain and cannot be easily compensated. Usually, a larger compensation capacitor is required and the number of current branches is very great. For example, the PMOS differential pair needs a current consumption branch and the NMOS differential pair needs a current consumption branch. The summing circuit for receiving the outputs of the two differential pairs and generating the voltage outputted form the node A needs to consume two current branches of the transistors N6 and N8. The output stage also needs to consume three circuit branches of the transistors P10, P11 and P12. Thus, the single operational amplifier needs to consume seven current consumption branches. So, the consumed current of the rail-to-rail class-AB operational amplifier is very high and the amplifier is not suitable for the circuit with the low power consumption.

FIG. 2 shows a representative drawing of a combination driver-summing circuit for a rail-to-rail differential amplifier, as disclosed in U.S. Pat. No. 5,311,145. As shown in FIG. 2, the rail-to-rail class-AB operational amplifier includes a differential pair composed of NMOS transistors $Q_{I3}$ and $Q_{I4}$ and a differential pair composed of PMOS transistors $Q_{I1}$ and $Q_{I2}$ to serve as an input. The output currents of the two differential pairs are summed up by a summing circuit, which is composed of transistors $Q_{S1}$, $Q_{S2}$, $Q_{S3}$, $Q_{S4}$, $Q_{S5}$, $Q_{S6}$, $Q_{S7}$ and $Q_{S8}$, and the summed current is outputted to a Class-AB control architecture circuit (transistors $Q_{D1}$ and $Q_{D2}$) to drive an output stage composed of transistors $Q_{O1}$ and $Q_{O2}$ to serve as an output of the operational amplifier so that the good ability of outputting and sinking a current source can be obtained.

In this rail-to-rail class-AB operational amplifier, the class-AB control architecture circuit and the summing circuit have been combined together to reduce the number of the power consumption branches. The operational amplifier exclusive of the current control circuits of the input stage transistors $Q_{I5}$ and $Q_{I6}$, the bias voltage generating circuits of the transistors $Q_{D1}$ and $Q_{D2}$, and the transistors $Q_{D3}$, $Q_{D4}$, $Q_{D5}$, $Q_{D6}$, $Q_{D7}$, $Q_{D8}$ and $I_{DB}$ leaves the main circuit of the operational amplifier. The power-consumption branches of the main circuit include one current branch composed of the transistors $Q_{I1}$ and $Q_{I2}$, one current consumption branch composed of the transistors $Q_{I3}$ and $Q_{I4}$, two current branches required by the summing circuit and including one current branch Is and the other current branch composed of the transistors $Q_{D1}$ and $Q_{D2}$, and a current consumption branch composed of the output transistors $Q_{O1}$ and $Q_{O2}$. So, the main circuit of the operational amplifier needs five current consumption branches, which is lower than that of the first prior art by two branches. However, the rail-to-rail class-AB operational amplifier cannot sufficiently save the power, and needs more transistors and the larger area in the prior art.

SUMMARY OF THE INVENTION

It is therefore an object of the invention to provide a rail-to-rail class-AB operational amplifier having a small area, the low power-consumption and a wide input output range.

The invention achieves the above-identified object by providing a rail-to-rail class-AB operational amplifier including a first differential pair unit for receiving a pair of differential signals and generating a first control signal, a second differential pair unit for receiving the differential signals and generating a second control signal, and an output stage for receiving the first control signal and the second control signal and then generating an output voltage.

The first differential pair unit includes a first active load, a first transistor differential pair and a first current source. The first active load has one terminal connected to an operation voltage. The first transistor differential pair has gates for respectively receiving the differential signals, drains connected to the other terminal of the first active load, and sources connected to each other. The first current source has one terminal connected to the sources of the first transistor differential pair, and the other terminal grounded.

The second differential pair unit includes a second current source, a second transistor differential pair and a second active load. The second current source has one terminal connected to the operation voltage. The second transistor differential pair has gates respectively receiving the differential signals, sources connected to each other and to the other terminal of the second current source. The second active load has one terminal connected to the drains of the second transistor differential pair, and the other terminal grounded.

The output stage includes a third current source, a fourth current source, a parallel transistor pair, a first output transistor and a second output transistor. The third current source has a first terminal connected to the operation voltage, and a second terminal for receiving the first control signal. The fourth current source has a first terminal for receiving the second control signal, and a second terminal grounded. The parallel transistor pair is disposed between the second terminal of the third current source and the first terminal of the fourth current source, and has gates for respectively receiving a pair of bias voltages. The first output transistor has a source connected to the operation voltage, a gate for receiving the first control signal, and a drain for generating the output voltage. The second output transistor has a source grounded, a gate for receiving the second control signal and a drain connected to the drain of the first output transistor.

Thus, the main architecture of the invention does not include a bias voltage generating circuit. So, only four current branches are required, the power-consumption is lower than that of the prior art architecture, and the area is smaller than that of the prior art architecture.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The rail-to-rail class-AB operational amplifier according to the invention will be described with reference to the accompanying drawings.

Figure 1:
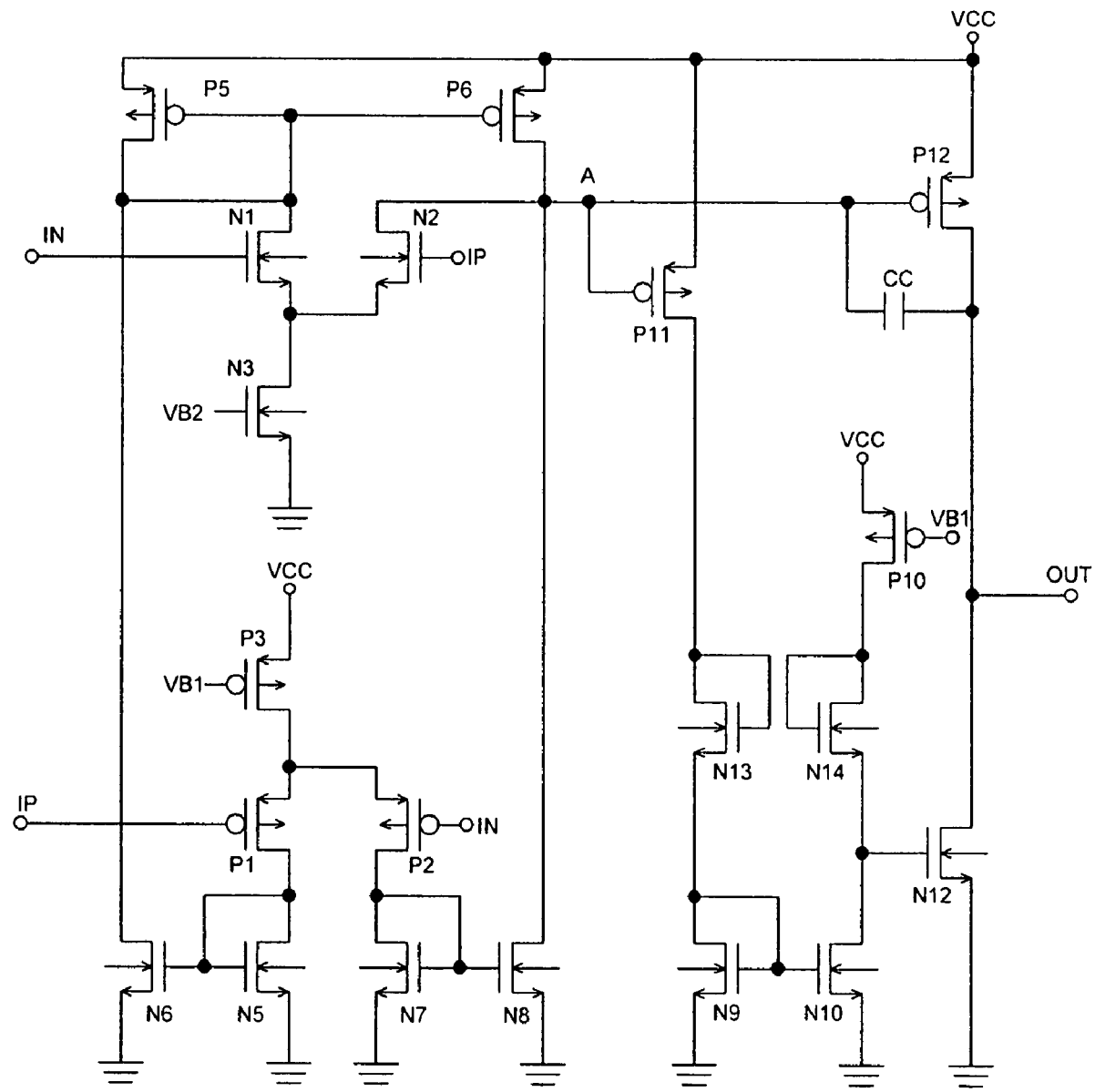
FIG. 1 shows a conventional rail-to-rail class-AB operational amplifier.
Figure 2:
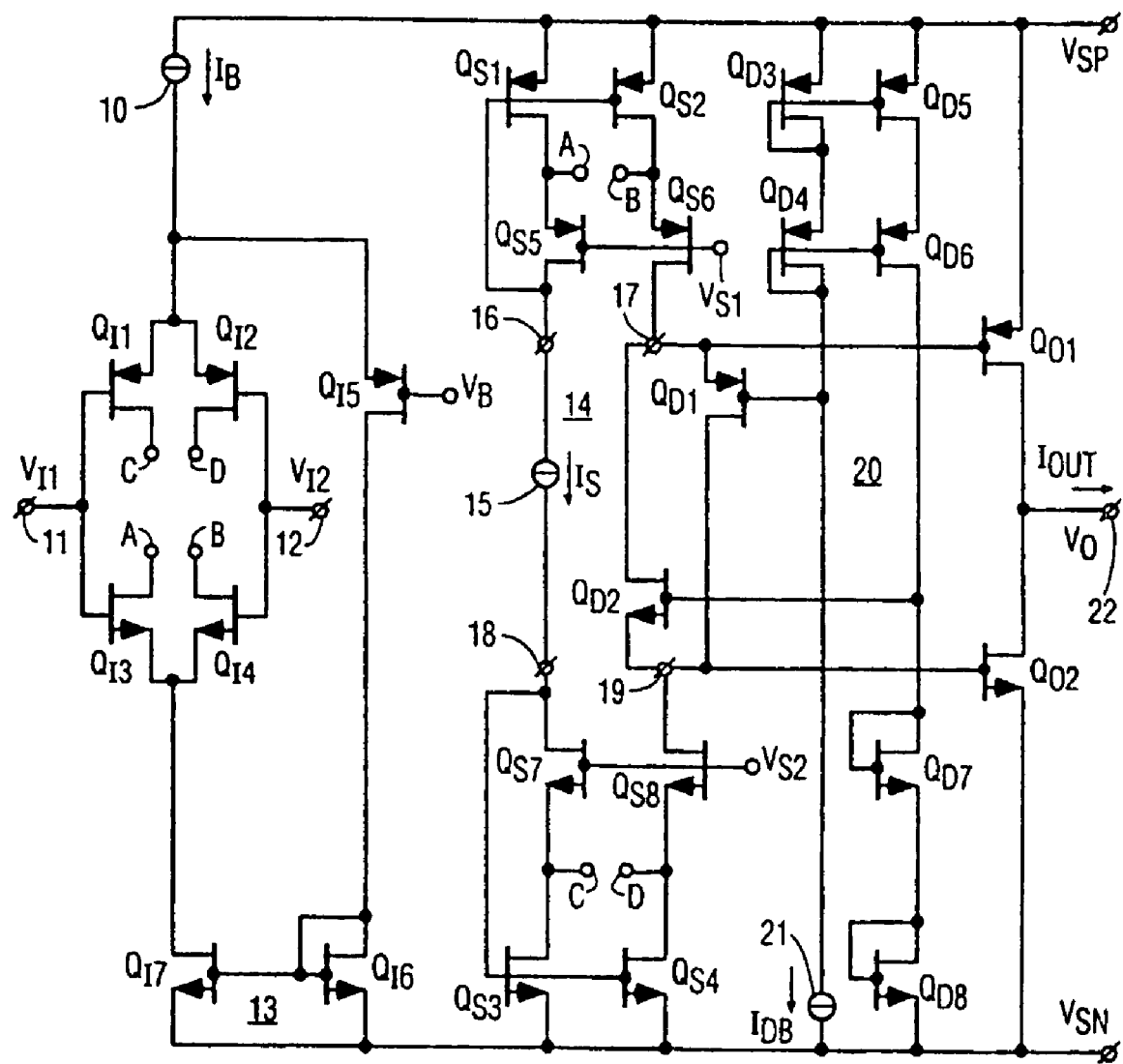
FIG. 2 shows another conventional rail-to-rail class-AB operational amplifier.
Figure 3:
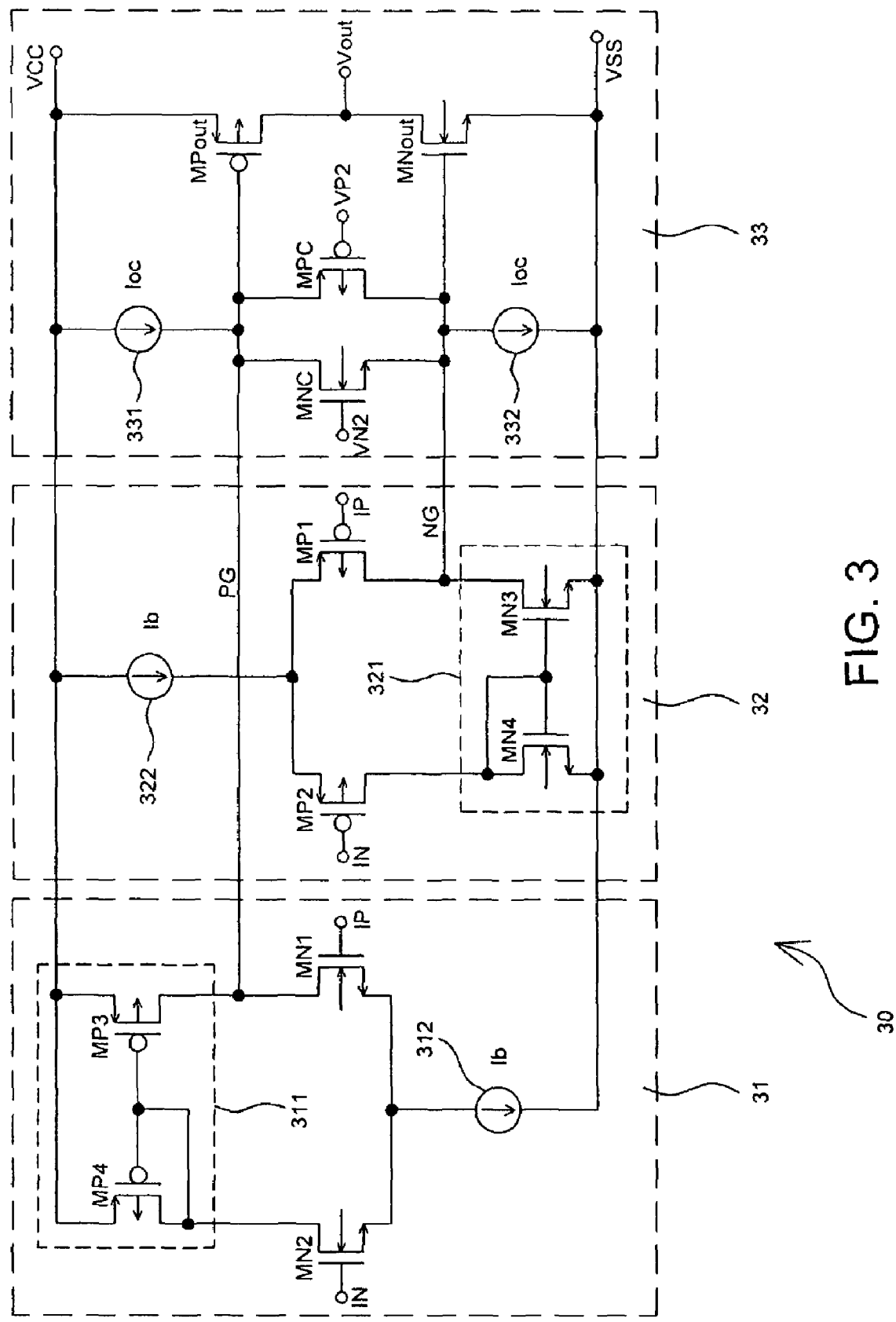
FIG. 3 shows a rail-to-rail class-AB operational amplifier according to the invention.

FIG. 3 shows a rail-to-rail class-AB operational amplifier 30 according to the invention. Referring to FIG. 3, the rail-to-rail class-AB operational amplifier 30 includes a first differential pair unit 31, a second differential pair unit 32 and an output stage 33. The first differential pair unit 31 and the second differential pair unit 32 constitute an input stage.

The first differential pair unit 31 has an active load 311, a differential pair composed of NMOS transistors MN1 and MN2, and a current source 312. Gates of the NMOS transistors MN1 and MN2 respectively receive input signals IP and IN, and a drain of the NMOS transistor MN1 generates a PG control signal. The second differential pair unit 32 has an active load 321, a differential pair composed of PMOS transistors MP1 and MP2, and a current source 322. Gates of the PMOS transistors MP1 and MP2 respectively receive the input signals IP and IN, and a drain of the PMOS transistor MP1 generates a NG control signal. The PG control signal and the NG control signal are outputted to the output stage 33. In this embodiment, the active load 311 is composed of two PMOS transistors MP3 and MP4, and the active load 321 is composed of two NMOS transistors MN3 and MN4. Of course, the active load may also be composed of other active devices and is not particularly restricted. For example, the active load 311 may be replaced with the circuit of FIG. 7, and the active load 321 may be replaced with the circuit of FIG. 8.

The output stage 33 mainly includes two current sources 331 and 332 and a class-AB output control circuit, which is composed of a pair of complementary transistors MNC and MPC and connected to and between the current sources 331 and 332 to control static currents of output transistors MPout and MNout. The class-AB control circuit can control the static currents of the output transistors, and the bias voltage Vgs_nmout of the output transistor MNout is controlled by the bias voltage Vgs_nmc of the transistor MNC. That is, Vgs_nmout=VN2−Vgs_nm c.

The bias voltage Vgs_mpout of the output transistor MPout is controlled by the bias voltage Vgs_mpc of the transistor MPC. That is, Vgs_mpout=VCC−(VP2+Vgs_mpc).

Thus, the static current of the output transistor can be controlled.

When the current is to be sunk from the outside or to be supplied and the higher or lower output voltage is to be outputted, the PG and NG control signals outputted from the input stage mainly provide the control. When the current is to be supplied or the higher voltage is to be provided, the input stage lowers the voltages of the PG and NG control signals. The lowered voltage of the PG control signal enables the transistor MPout to supply the current and to increase the output voltage. The lowered voltage of the NG control signal can reduce the static current of the transistor MNout so that most of the current flowing through the transistor MPout can be supplied for the output. When the current is to be sunk or the lower voltage is to be provided, the input stage increases the voltages of the PG and NG control signals. The increased voltage of the NG control signal enables the transistor MNout to sink the current and to decrease the output voltage. The increased voltage of the PG control signal can reduce the static current of the transistor MPout so that most of the current flowing through the transistor MNout can be sunk and outputted.

Figure 4:
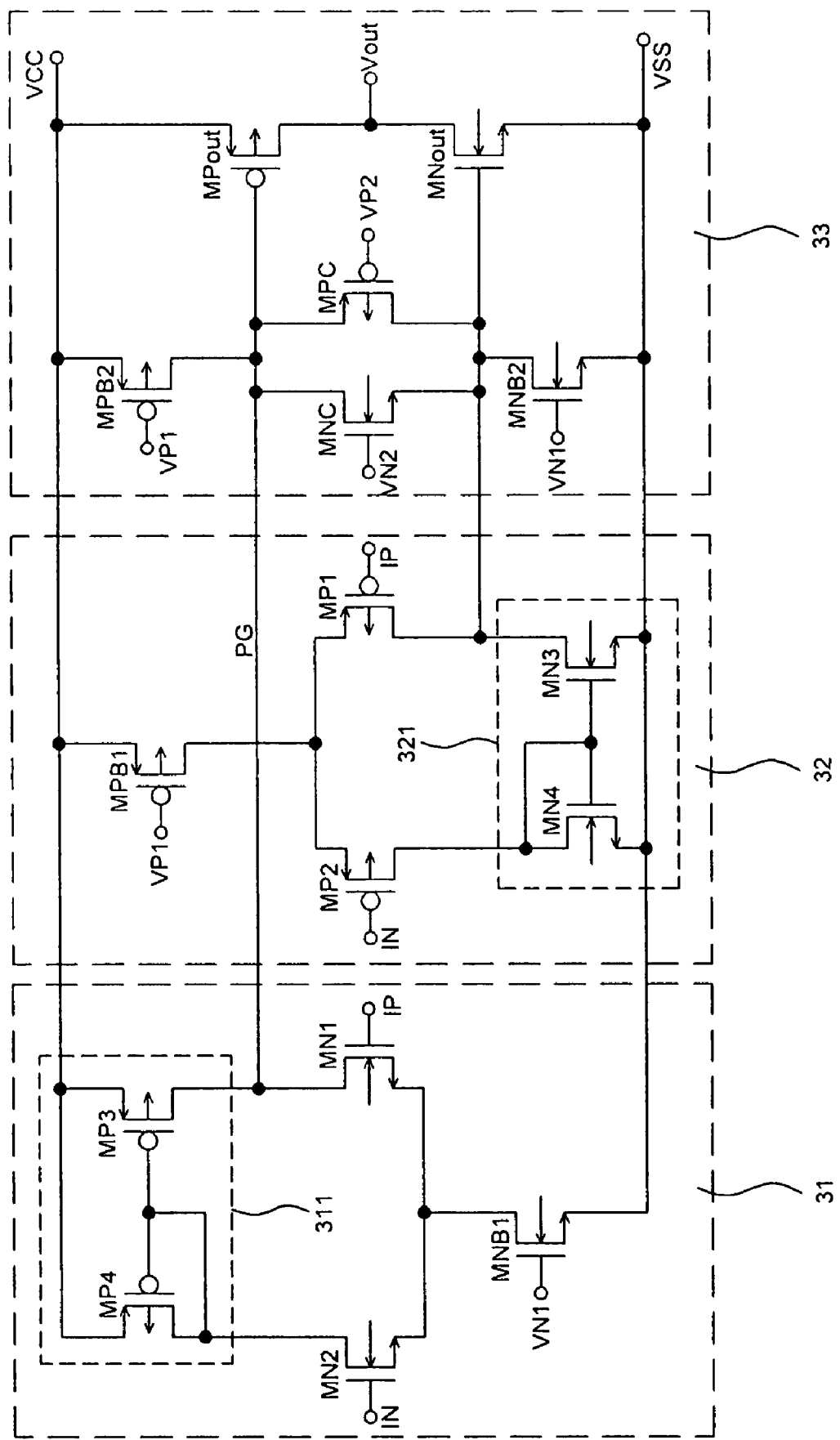
FIG. 4 shows an actual circuit of the rail-to-rail class-AB operational amplifier according to the invention.

FIG. 4 shows an actual circuit of the rail-to-rail class-AB operational amplifier according to the invention. As shown in FIG. 4, the current source 312 is replaced with the transistor MNB1, the current source 322 is replaced with the transistor MPB1, the current source 331 is replaced with the transistor MPB2 and the current source 332 is replaced with the transistor MNB2. Thus, as shown in FIG. 4, the circuit architecture of the rail-to-rail class-AB operational amplifier of the invention is very simple, the constituted area is relatively small, and the static current is relatively lower.

Figure 5:
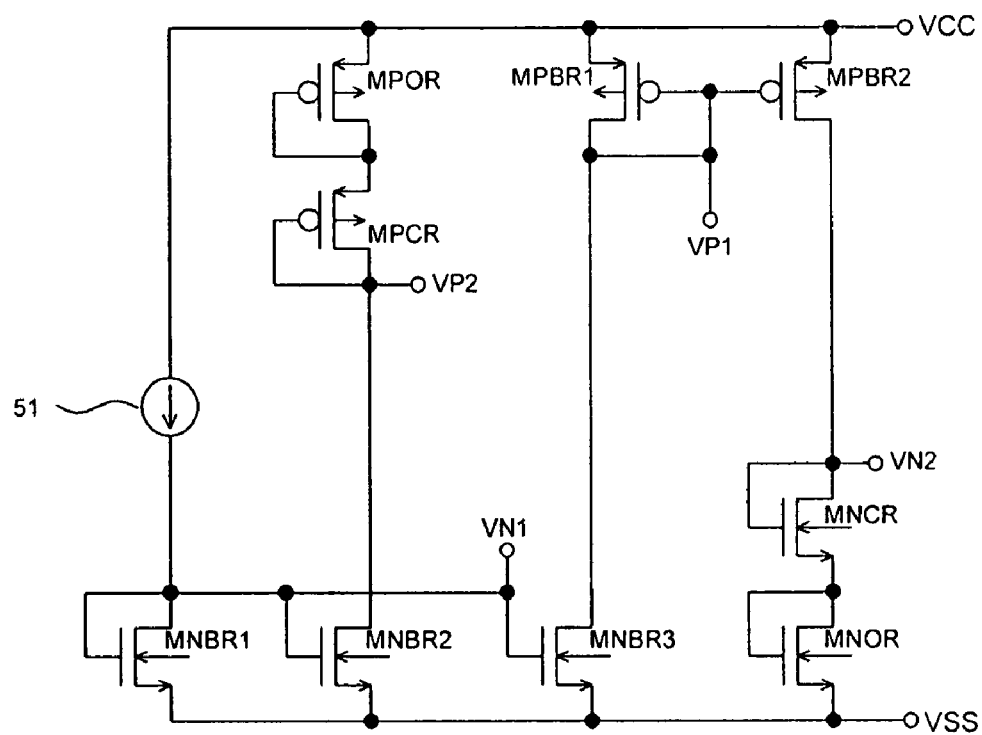
FIG. 5 shows a bias circuit according to one embodiment of the invention.

FIG. 5 shows a bias circuit 50 for providing voltages VP1, VP2, VN1 and VN2 for biasing the transistor of the rail-to-rail class-AB operational amplifier of FIG. 4 according to one embodiment of the invention. Referring to FIG. 5, the bias circuit 50 includes a current source 51, four PMOS transistors MPOR, MPCR, MPBR1 and MPBR2, and five NMOS transistors MNBR1, MNBR2, MNBR3, MNCR and MNOR. The gate and the drain of the transistor MPOR are connected to each other and to the source of the transistor MPCR. The gate and the drain of the transistor MPCR are connected to each other and the drain of the transistor MPCR generates the voltage VP2. The gates of the transistors MNBR1, MNBR2 and MNBR3 are connected together and receive the current of the current source 51 and generate the voltage VN1. The drain of the transistor MNBR1 is also connected to the gate thereof. The drain of the transistor MNBR2 is connected to the drain of the transistor MPCR. The sources of the transistors MPBR1 and MPBR2 are connected to the operation voltage, and the gates of the transistors MPBR1 and MPBR2 are connected to each other and generate the voltage VP1. Meanwhile, the gate and the drain of the transistor MPBR1 are connected to each other. The drain of the transistor MPBR1 is connected to the drain of the transistor MNBR3. The gate and the drain of the transistor MNOR are connected to each other and to the source of the transistor MNCR. The gate and the drain of the transistor MNCR are connected to each other, and the drain of the transistor MNCR generates the voltage VN2. The drain of the transistor MNCR is further connected to the drain of the transistor MPBR2.

Figure 6:
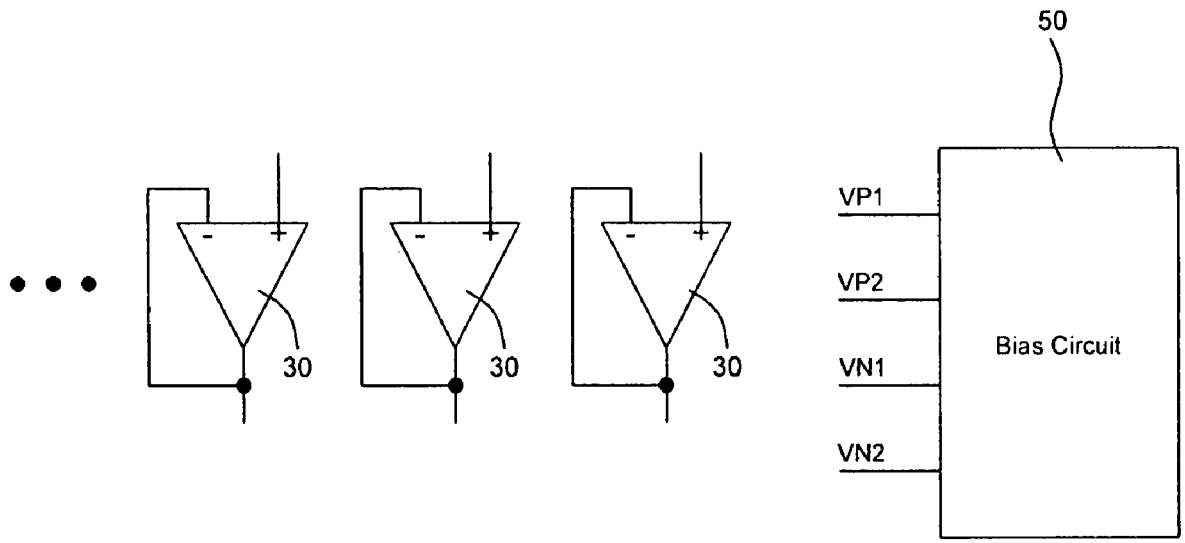
FIG. 6 shows an actual application example of the invention.

In order to reduce the area and the power-consumption, not each of the rail-to-rail class-AB operational amplifiers is equipped with a bias circuit in the practical application. Instead, one bias circuit is disposed among a plurality of operational amplifiers, as shown in FIG. 6. Consequently, the power-consumption and the area can be greatly reduced. For example, a driver IC of a thin film transistor liquid crystal display (TFT-LCD) needs a great number of operational amplifiers to drive a panel. Using the operational amplifier with this architecture can greatly reduce the area and the power-consumption.

Figure 7:
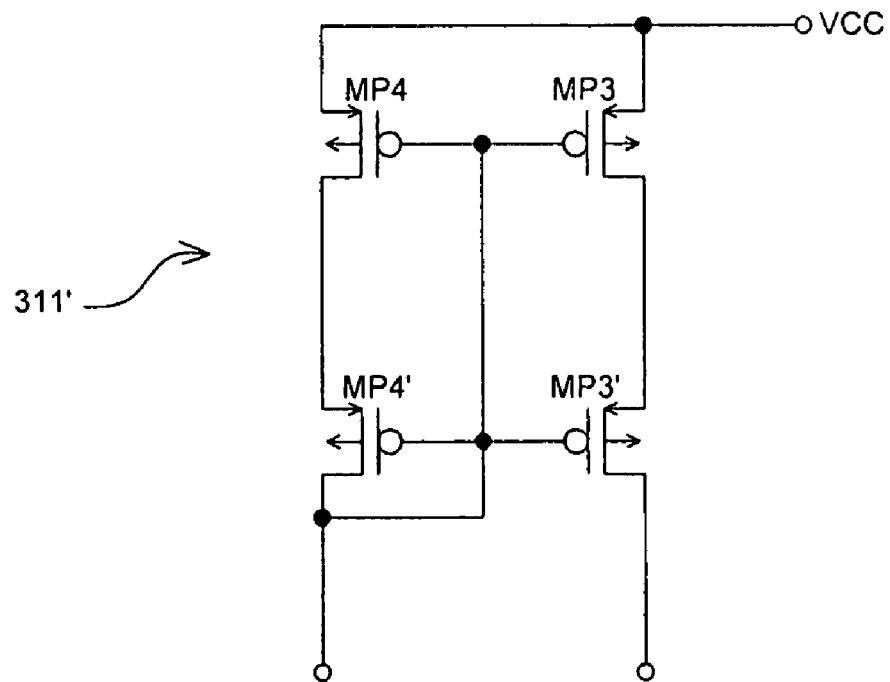
FIGS. 7 and 8 show active loads according to another embodiment of the invention.
Figure 8:
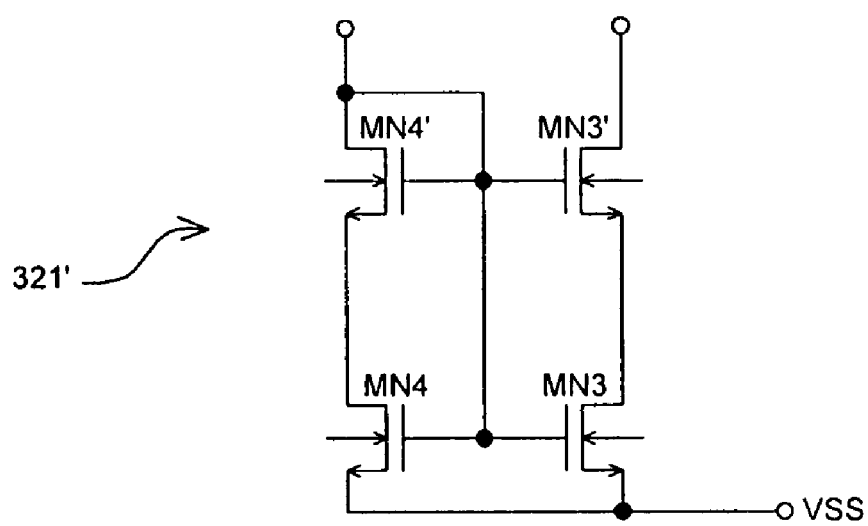

FIGS. 7 and 8 show active loads according to another embodiment of the invention. Referring to FIG. 7, the active load 311' includes four PMOS transistors MP3, MP3', MP4 and MP4'. Referring to FIG. 8, the active load 321' includes four NMOS transistors MN3, MN3', MN4 and MN4'.

Thus, the rail-to-rail class-AB operational amplifier of the invention includes the following features.

1. The input stage is simple because only two differential pairs having the active loads are needed, and only two current branches for power-consumption are needed. In fact, no extra summing circuit is needed to increase the consumed current. The summing circuit of each of the first and second prior arts needs at least two added current consumption branches.

2. The architecture of the invention uses the class-AB output control circuit composed of complementary transistors connected in parallel to control the output transistor, while the second prior art has the class-AB output control circuit integrated in the summing circuit. The architecture of the invention has an additional current branch due to the class-AB output control circuit, but the current of the current branch may be limited to a very small current in order to save the power and reduce the shift of the output voltage.

3. The output stage of the invention does not contain the bias voltage generating circuit. The prior art architecture needs to consume five current branches, and the architecture of this invention contains the output stage but does not contain the bias voltage generating circuit, and thus needs only four current branches. So, the power-consumption is lower than that of the prior art architecture.

4. The architecture of the invention is simple so that the area is smaller than that of the prior art architecture.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A rail-to-rail class-AB operational amplifier, comprising:
   a first differential pair unit, for receiving a pair of differential signals and generating a first control signal;
   a second differential pair unit, for receiving the pair of differential signals and generating a second control signal; and
   an output stage, for receiving the first control signal and the second control signal and then generating an output voltage, wherein:
   the first differential pair unit includes:
      a first active load, having one terminal connected to an operation voltage;
      a first transistor differential pair, having gates for respectively receiving the pair of differential signals, drains connected to the first active load and sources connected to each other; and
      a first current source, having one terminal connected to the sources of the first transistor differential pair, and the other terminal grounded;
   the second differential pair unit includes:
      a second current source, having one terminal connected to the operation voltage;
      a second transistor differential pair, having gates for receiving the differential signals, and sources connected to each other and to the other terminal of the second current source; and
      a second active load, having one terminal connected to the second transistor differential pair, and the other terminal grounded; and
   the output stage includes:
      a third current source, having a first terminal connected to the operation voltage and a second terminal for receiving the first control signal;
      a fourth current source, having a first terminal for receiving the second control signal, and a second terminal grounded;
      a parallel transistor pair, which is disposed between the second terminal of the third current source and the first terminal of the fourth current source, and has gates for respectively receiving a pair of bias voltages;
      a first output transistor, having a source connected to the operation voltage, a gate for receiving the first control signal and a drain for generating the output voltage; and
      a second output transistor, having a source grounded, a gate for receiving the second control signal and a drain connected to the drain of the first output transistor.

2. The operational amplifier according to claim 1, wherein the first current source is a transistor.

3. The operational amplifier according to claim 1, wherein the second current source is a transistor.

4. The operational amplifier according to claim 1, wherein the third current source is a transistor.

5. The operational amplifier according to claim 1, wherein the fourth current source is a transistor.

6. The operational amplifier according to claim 1, wherein the first active load comprises:
   a first load transistor, having a source connected to the operation voltage, and a gate and a drain both connected to each other and to the drain of a transistor of the first transistor differential pair; and
   a second load transistor, having a source connected to the operation voltage, a gate connected to the gate of the first load transistor and a drain connected to the drain of the other transistor of the first transistor differential pair.

7. The operational amplifier according to claim 1, wherein the second active load comprises:
   a first load transistor, having a source grounded, and a gate and a drain both connected to each other and to the drain of one transistor of the second transistor differential pair; and
   a second load transistor, having a source grounded, a gate connected to the gate of the first load transistor and a drain connected to the drain of the other transistor of the second transistor differential pair.

8. The operational amplifier according to claim 1, wherein the first active load comprises:

a first load transistor, having a source connected to the operation voltage;

a second load transistor, having a source connected to a drain of the first load transistor, a gate connected to a gate of the first load transistor, and a drain connected to the gate of the second load transistor and to the drain of one transistor of the first transistor differential pair;

a third load transistor, having a source connected to the operation voltage, and a gate connected to the gate of the first load transistor; and a fourth load transistor, having a source connected to a drain of the third load transistor, a gate connected to the gate of the third load transistor, and a drain connected to the drain of the other transistor of the first transistor differential pair.

9. The operational amplifier according to claim 1, wherein the second active load comprises:

a first load transistor, having a source grounded;

a second load transistor, having a source connected to a drain of the first load transistor, a gate connected to a gate of the first load transistor, and a drain connected to the gate of the second load transistor and the drain of one transistor of the second transistor differential pair;

a third load transistor, having a source grounded, and a gate connected to the gate of the first load transistor; and a fourth load transistor, having a source connected to a drain of the third load transistor, a gate connected to the gate of the third load transistor and a drain connected to the drain of the other transistor of the second transistor differential pair.

* * * * *